United States Patent [19]

Logan et al.

[11] Patent Number: 5,155,652

[45] Date of Patent: Oct. 13, 1992

[54] TEMPERATURE CYCLING CERAMIC ELECTROSTATIC CHUCK

[75] Inventors: Joseph S. Logan, Poughkeepsie; Raymond R. Ruckel, Garrison; Robert E. Tompkins, Pleasant Valley; Robert P. Westerfield, Jr., Montgomery, all of N.Y.

[73] Assignee: International Business Machines Corporation, Armonk, N.Y.

[21] Appl. No.: 694,698

[22] Filed: May 2, 1991

[51] Int. Cl.$^5$ .............................. H02N 13/00
[52] U.S. Cl. .................... 361/234; 279/128
[58] Field of Search ................ 361/230–235; 219/457, 464, 465, 468; 279/1 M, 128; 248/309.4; 29/900; 269/8, 903

[56] References Cited

U.S. PATENT DOCUMENTS

| | | | |
|---|---|---|---|
| 4,025,997 | 5/1977 | Gernitis et al. | 428/663 |
| 4,184,188 | 1/1980 | Briglia | 361/234 |
| 4,384,918 | 5/1983 | Abe | 361/234 X |
| 4,480,284 | 10/1984 | Tojo et al. | 361/234 |
| 4,502,094 | 2/1985 | Lewin | 361/234 |
| 4,536,645 | 8/1985 | Mio et al. | 219/464 X |
| 4,645,218 | 2/1987 | Ooshio et al. | 361/234 X |
| 4,665,463 | 5/1987 | Ward | 361/234 |
| 4,692,836 | 9/1987 | Suzuki | 361/234 |
| 4,724,510 | 2/1988 | Wicker | 361/234 |
| 4,831,212 | 5/1989 | Ogata et al. | 174/52.4 |
| 4,897,171 | 1/1990 | Ohmi | 204/290 |
| 4,962,441 | 10/1990 | Collins | 361/234 |
| 4,969,168 | 11/1990 | Sakamota et al. | 378/34 |

FOREIGN PATENT DOCUMENTS 360529 3/1990 European Pat. Off.
1443215 7/1976 United Kingdom.

OTHER PUBLICATIONS

Fortuno, G. and Keller, J. in: IBM Technical Disclosure Bulletin, vol. 31, No. 1, Jun. 1988, pp. 462–464.
Grant and Hackh's Chemical Dictionary, 5th ed. N.Y., McGraw Hill, 1987, p. 269.

Primary Examiner—A. D. Pellinen
Assistant Examiner—Fritz M. Fleming
Attorney, Agent, or Firm—Richard A. Romanchik; Michael J. Balconi-Lamica

[57] ABSTRACT

An electrostatic chuck 40 assembly includes, from top to bottom: a top isolation layer 42; an electrostatic pattern layer 44 comprised of an electrically conductive electrostatic pattern 46 disposed on a substrate 45; a heating layer 50 comprised of an electrically conductive heating pattern 54 disposed on a substrate 52; a support 60; and, a heat sink base 70 having backside cooling and insulating channels 78, 80 provided therein.

6 Claims, 3 Drawing Sheets

TEMPERATURE CYCLING CERAMIC ELECTROSTATIC CHUCK

TECHNICAL FIELD

The present invention relates to chucks utilized for clamping wafers in the manufacture of semiconductors, and more particularly, a ceramic electrostatic chuck which is temperature cyclable and operable over a wide temperature range.

BACKGROUND ART

Electrostatic chucks are devices which have gained wide usage in the semiconductor field for clamping semiconductor wafers during manufacturing processes. These chucks eliminate the need for mechanical clamping mechanisms, which are often clumsy and induce contamination into the processing chambers. Typical electrostatic chucks utilized in the prior art can be found in U.S. Pat. No. 4,184,188 (Briglia); U.S. Pat. No. 4,384,918 (Abe); U.S. Pat. No. 4,724,510 (Wicker, et al.); and U.S. Pat. No. 4,665,463 (Ward, et al.).

Briglia discloses an electrostatic clamp having interdigitated, polarized electrodes disposed between layers of silicone rubber and supported by an aluminum plate which is attached to a water cooled base. The wafer under process sits on top of a layer of silicone rubber and is clamped by the electromagnetic field generated by the underlying electrodes. Briglia also discloses an alternative embodiment wherein aluminum electrodes are deposited onto an alumina support and insulated by oxidation. The electrode structure is secured "both mechanically and with good thermal conductivity" by a "water cooled plate".

Abe discloses an electrostatic chuck wherein aluminum clamping electrodes are insulated by either polytetrafluorethylene, polyethylene or silicon gum. The electrodes are, in turn supported by a water cooled support base, or a heated support base.

Wicker, et al. discloses an electrostatic chuck wherein the clamping electrodes are deposited on a semiconductor wafer and insulated by a layer of either CVD oxide, polyimide, or a suitable glass. The clamp is supported by "conductive support".

Ward, et al. discloses an electrostatic chuck wherein a center, circular clamping electrode is insulated by a layer of epoxy resin, such as Araldite loaded with particulate alumina or mica. The center electrode also serves as the for the wafer in process.

All of the above mentioned electrostatic chucks have insulated electrodes supported by an undefined cooling "support". A problem exists with these chucks and other known electrostatic chucks, however, in that the materials utilized for the electrical insulators have radically different thermal expansion characteristics than the materials utilized for the cooling supports. Therefore, subjecting these chucks to widely varying temperature cycles causes separation between the dissimilar materials. As a result, the chucks can only be utilized in very narrow temperature ranges, thereby limiting the application of each chuck to selective manufacturing processes. Even with this limitation, the chucks suffer from short lifetimes, low reliability and high costs. These problems are amplified because the chucks are a major cause of "down time" on the manufacturing line.

An electrostatic chuck which overcomes the above mentioned deficiencies is therefore, highly desirable.

DISCLOSURE OF THE INVENTION

An object of the present invention is to provide for an improved electrostatic chuck which can be utilized over widely varying temperature cycles.

Another object of the present invention is to provide for an improved electrostatic chuck which clamps wafers without having to make electrical contact to the wafers.

Another object of the present invention is to provide for an improved electrostatic chuck which has superior heat transfer capability.

Yet another object of the present invention is to provide an improved electrostatic chuck which provides temperature cycling to wafers under process.

According to the present invention, an improved electrostatic semiconductor chuck includes an electrostatic pattern layer comprised of an electrically conductive electrostatic pattern disposed on a substrate. The electrostatic pattern layer is disposed on a heater layer which is comprised of an electrically conductive heating pattern disposed on a substrate. The heating layer is disposed on a support, and a heat sink base supports the entire structure and can provide either thermal conductivity or thermal isolation. An isolation layer is placed on top of the electrostatic pattern layer to isolate the wafer from coming in contact with the metal pattern.

The present invention provides for a universal chuck which can be used in a wide variety of manufacturing processes having widely varying temperature ranges. Wafers in process can either be cooled or heated by the present chuck. It is light weight and easily manufacturable. In addition, the present invention can be manufactured within exceptional flatness specifications to thereby provide superior clamping force with minimal electrical energy.

These and other objects, features and advantages of the present invention will become more apparent in light of the detailed description of exemplary embodiments thereof as illustrated by the drawings.

BEST MODE FOR CARRYING OUT THE INVENTION

Figure 1:
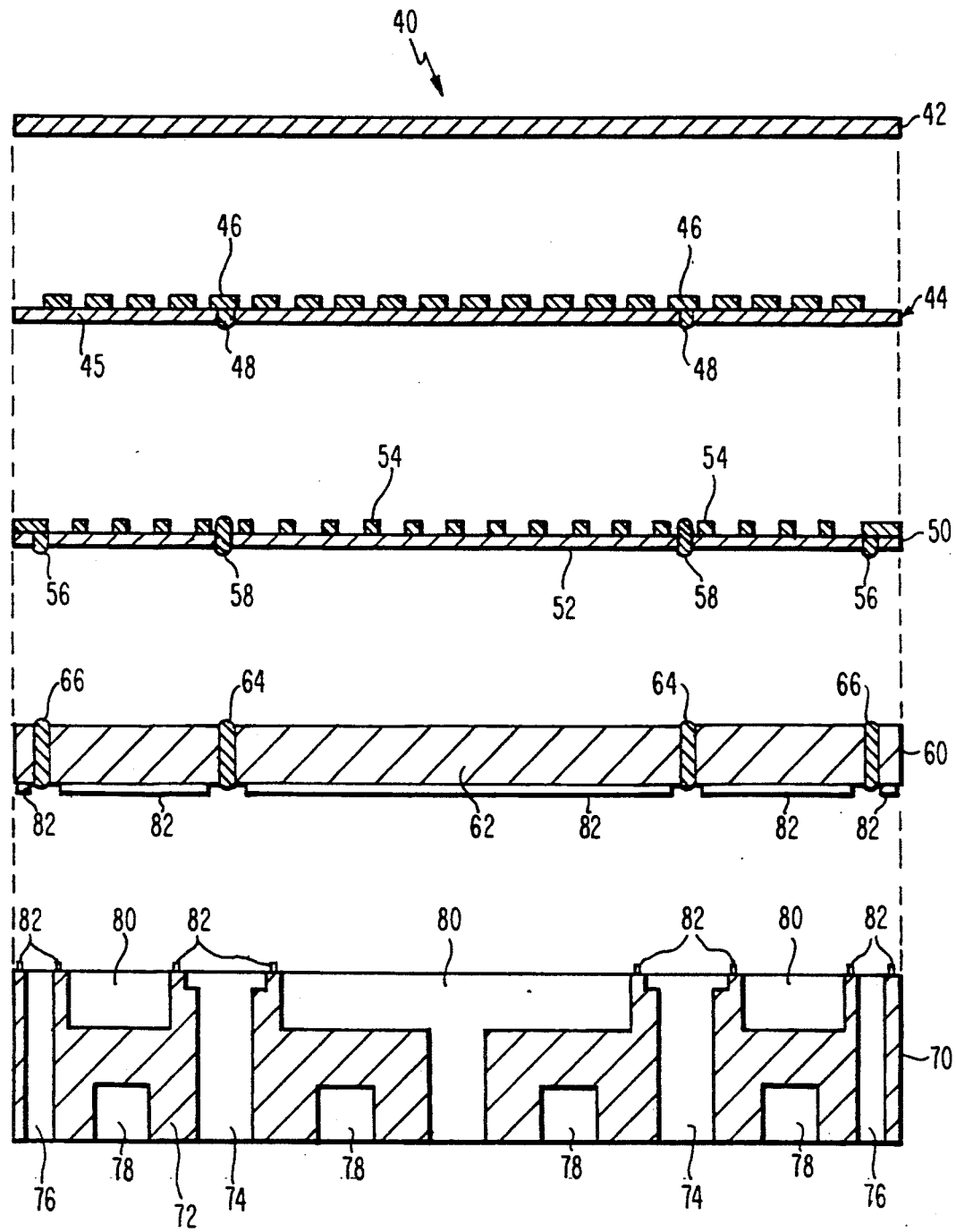
FIG. 1 is an exploded, cross-sectional view of a first embodiment of the electrostatic chuck of the present invention.

Referring now to FIG. 1, a first embodiment 40 of the electrostatic chuck of the present invention includes a top isolation layer 42 to which the semiconductor wafer under process (not shown) is clamped to.

The top isolation layer 42 is disposed on top of an electrostatic pattern layer 44, which is comprised of a having an electrically conductive electrostatic pattern 46 disposed thereon. Metal via lines 48 descend through the substrate 45 and provide a means for conducting electrical energy to the electrostatic pattern 46.

The electrostatic pattern 46 is comprised of two equal areas of electrically conductive material in a symmetrically distributed pattern. The pattern is formed by alternating conductive "strips" approximately 0.75 mm wide and spaced about 0.25 mm apart. Each alternately conductive "strip" is electrically energized with an opposite DC potential, thereby resulting in capacitance between the alternating conductive "strips". The conductive pattern 46 will be shown and described in greater detail hereinafter in FIG. 2.

The preferred material for isolation layer 42 is BORALLOY, which is a pyrolytidc boron nitride. BORALLOY is a trademark of the Union Carbide Corporation. Alternatively, isolation layer 42 may be fabricated from electrically insulative, thermally conductive, dielectric materials with thermal-mechanical characteristics (i.e. thermal expansion rate and thermal conductivity) compatible with boron nitride. For example, these materials may include boron nitride, polyimide, alumina, quartz and diamond coating. The selection of the material utilized will of course be governed by the temperatures, etchants and processing environment to which the chuck will be exposed.

It is to be noted that the thickness of the isolation layer 42 is dependent on two factors. First, the thickness must not be so great that unreasonably high voltages are needed to adequately clamp the wafer. In the preferred embodiment, the finished isolation layer 42 is about 0.05 mm thick. It has been found that impractical voltages are required to maintain adequate wafer clamping for isolation layer 42 thicknesses over 0.25 mm. Secondly, the thickness must be less than the spacing between the alternating conductive "strips", otherwise dielectric breakdown will occur between adjacent conductive strips of pattern 46 at voltages necessary to clamp the wafer.

The electrostatic pattern layer 44 is disposed on top of a heater layer 50, which is comprised of a substrate 52 having a conductive heating pattern 54 disposed thereon. It is preferable that a pyrolytic boron nitride, such as BORALLOY, be utilized for substrate 52. The heating conductor 54 is preferably comprised of a pyrolytic graphite, such as BORALECTRIC. BORALECTRIC is also a trademark of the Union Carbide Corporation. The heater layer 50 also has metal via lines 56 extending therethrough for conducting electrical energy to the heating pattern 54. The heater layer 50 also has metal via lines 58 extending therethrough for conducting electrical energy to metal via lines 48 of electrostatic pattern layer 44.

The heating layer 50 is disposed on top of a support 60, which is comprised of a boron nitride substrate 62, such as BORALLOY. Support 60 has metal vias 64 disposed therethrough for conducting electrical energy to the metal vias 58 of the heating layer 50. Support 60 also has metal via lines 66 disposed therethrough for conducting electrical energy to metal via lines 56 of heating layer 50.

The support 60 is disposed on top of a heat sink base 70, which is comprised of a thermally conductive block or substrate 72, having clearance holes 74 extending therethrough for facilitating electrical contact with the metal vias 64 of support 60 from the bottom of heat sink base 70. Heat sink base 70 also has clearance holes 76 extending therethrough for facilitating electrical contact with metal via lines 66 of support 60 from the bottom of heat sink base 70. Heat sink base 70 also has channels 78 provided therein for circulating a cooling fluid in order to transfer heat away from the chuck 40. Heat sink base 70 also has temperature controlling chambers 80, which are voided areas in the top portion of the heat sink base 70. Chambers 80 are maintained in a vacuum state when heat is required to be supplied to the product wafer (not shown) because the vacuum acts as a thermal barrier and prevents heat generated by the heating layer 50 from being transferred through the heat sink base 70. Conversely, when heat is to be removed from the product wafer (wafer cooling), the chambers 80 are filled with a gas having a high thermal conductivity, such as He. The aforementioned function of the heat sink base 70 therefore facilitates temperature cycling of wafers under process. It is to be noted that the majority of manufacturing processes require heat to be transferred away from the product wafer and consequently, chambers 80 will be filled with gas most of the time.

The material selection for the heat sink base 70 is critical, because it must match the thermal expansion rate of the substrates 42, 45, 52, and 62. KOVAR, an iron/nickel/cobalt alloy (29Ni/17Co/53Fe), is the preferred material to be utilized for this purpose because its thermal expansion characteristics match that of the substrates, and because it is a good thermal conductor. KOVAR is a registered trademark of the Westinghouse Electric Co.

In the preferred embodiment, prior to bonding, the isolation layer 42 is about 0.05 mm thick, the electrostatic pattern layer 44 is about 0.50 mm thick, the heating layer 50 is about 0.50 mm thick and the support 60 is about 1.50 mm thick.

A first method of bonding the heat sink base 70 to the bottom of the support 60 is by brazing, whereby by gold contact pads 82 are deposited on the respective bonding surfaces, the pieces are fitted together, and the assembly is heated in a brazing furnace. A second method of bonding the heat sink base 70 to the bottom of the support 60 is to apply a thermally conductive ceramic cement, such as CERAMABOND 552, which is manufactured by Aremco Products Inc., to the respective bonding surfaces, fit the pieces together and heat the assembly according to manufacturer's curing schedule. CERAMABOND is a trademark of Aremco Products Inc. A third method of bonding the heat sink base 70 to the bottom of the support 60 is to mechanicallly clamp the two pieces together by, for instance, fabricating a flange on the bottom of the support 60 and a clamp ring on the top of the heat sink base 70 and clamp the pieces together. A seal ring may be utilized between the two pieces in such an instance, to provide a seal. It is to be noted that other techniques not described herein may be utilized to bond or attach the support 60 to the heatsink base 70.

Figure 2:
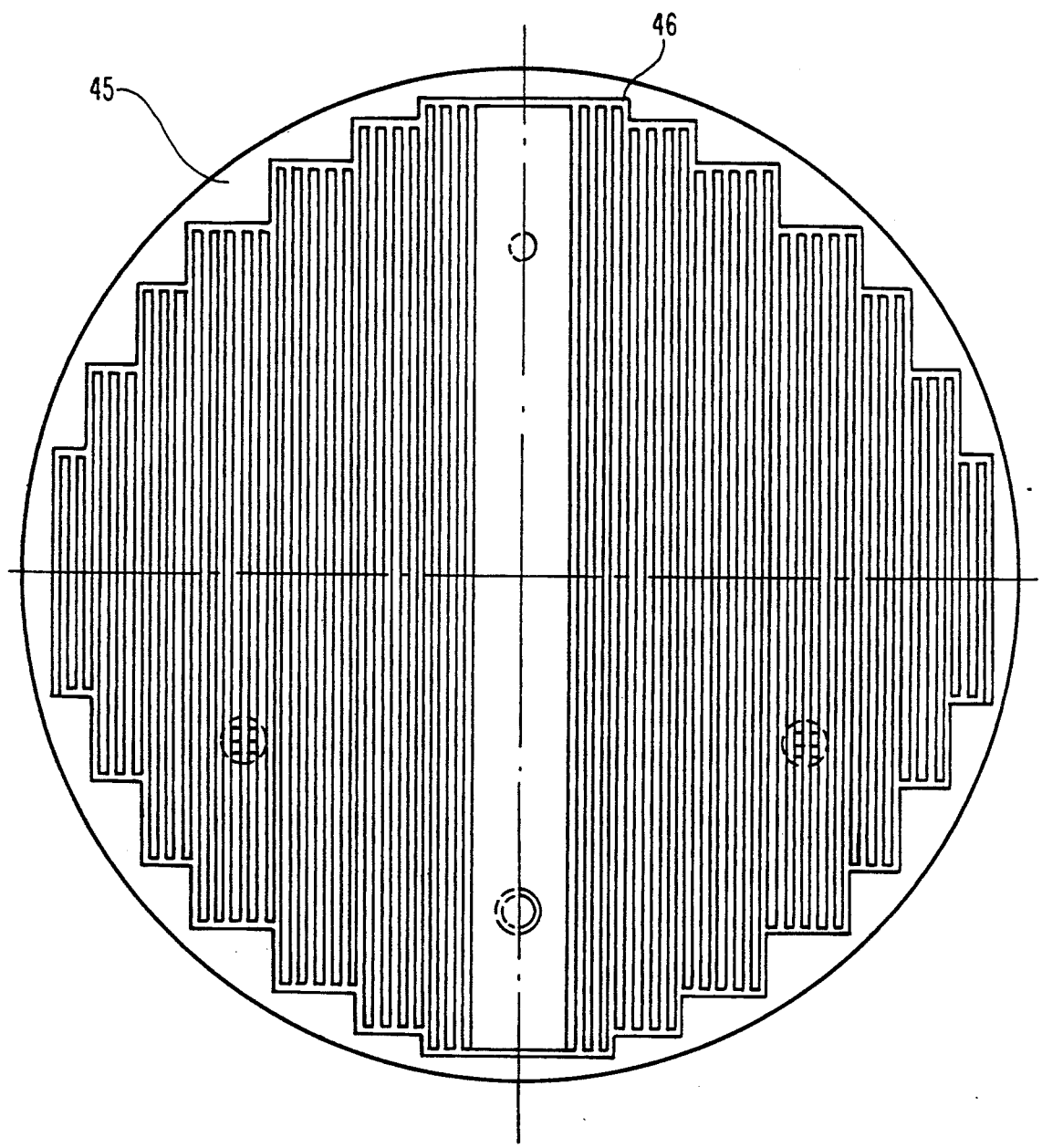
FIG. 2 is a top view of the metal pattern layer of the electrostatic chuck of the present invention.

Referring now to FIG. 2, the electrostatic conductive pattern 46 disposed on electrostatic pattern layer 44 is comprised of two equal areas of conductors formed in a symmetrically distributed pattern. It is preferable that the pattern 46 have a maximum amount of strips with minimum distance between strips, while maintaining an adequately thick isolation layer 42. The conductive material may be any of a number of conductors. The material utilized, however, must have a thermal expansion rate similar to the electrostatic pattern layer substrate 45 material in order to avoid separation of the pattern from the substrate. For instance, pyrolytic graphite has been found to be a suitable material.

Figure 3:
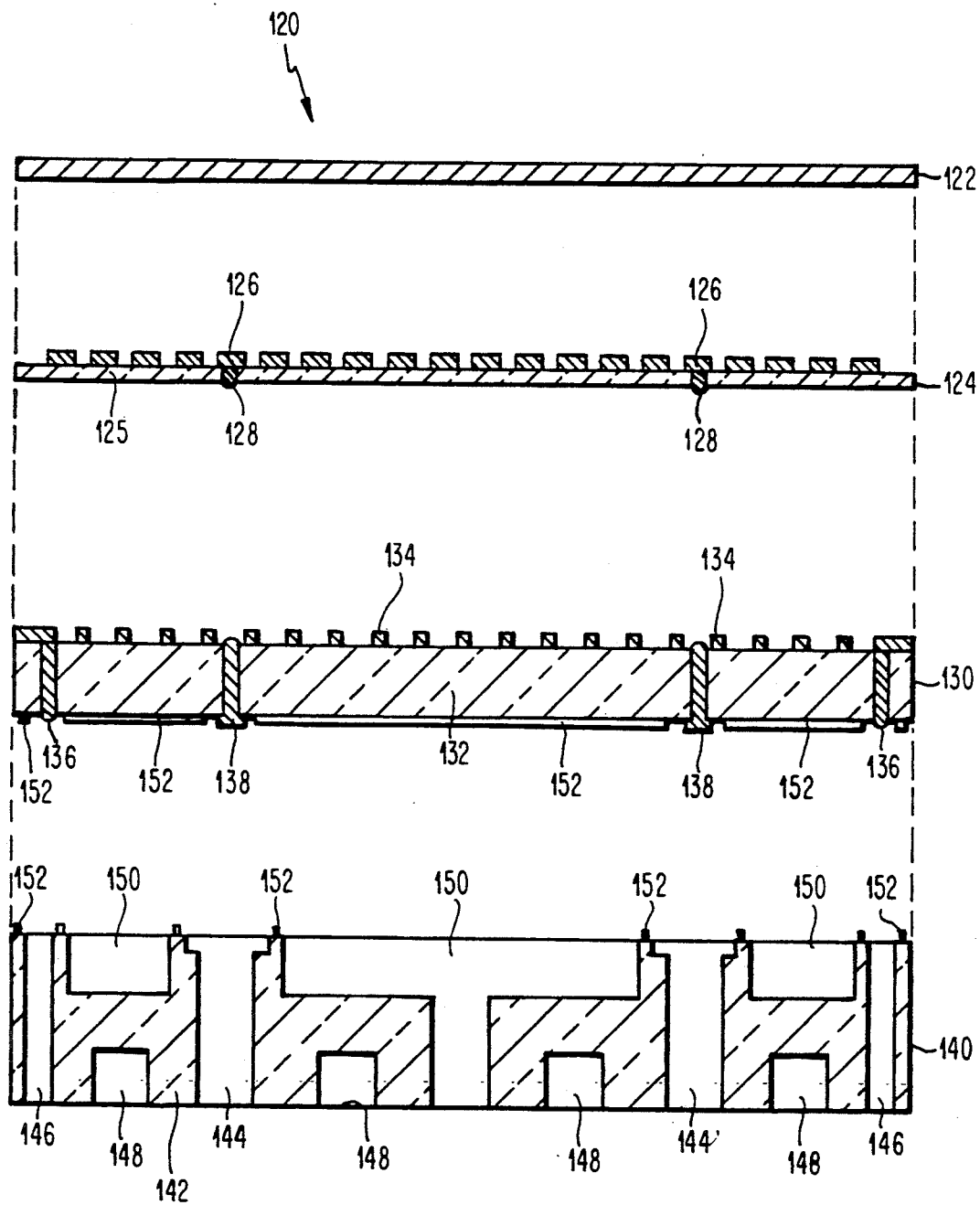
FIG. 3 is an exploded, cross-sectional view of a second embodiment of the electrostatic chuck of the present invention.

Referring now to FIG. 3, a second embodiment 120 of the electrostatic chuck of the present invention includes an isolation layer 122 disposed on an electrostatic pattern layer 124 which is comprised of a substrate 125 having a conductive electrostatic pattern 126 disposed thereon. Conductive vias 128 extend through substrate 125 and are connected to pattern 126. The electrostatic pattern layer 124 is disposed on a heating layer 130 which is comprised of a substrate 132 having a conductive heating pattern 134 disposed thereon. Conductive vias 136, 138 extend through substrate 132 and provide electrical connection to heating pattern 134 and conductive vias 128, respectively. Heating layer 130 is disposed on a heat sink base 140, comprised of a substrate 142 having clearance holes 144, 146 extending therethrough for providing access to conductive vias 138, 136 respectively. Heating layer 130 can be bonded to heat sink base 140 using any one of the bonding methods previously discussed with respect to bonding support 60 to heat sink base 70 of the first embodiment. For instance, heating layer 130 can be brazed to heat sink base 140 by depositing gold contact pads 152 onto heating layer 130 and heat sink base 140, fitting the pieces together and heating the assembly in a brazing furnace. Substrate 142 also has cooling channels 148 machined therein for providing circulation of a cooling liquid therethrough and chambers 150, which are evacuated to provide thermal isolation when the heating pattern is provided power and filled with a thermally conductive gas to provide cooling when the wafer being clamped is to be cooled.

The aforementioned second embodiment is similar to the embodiment described and illustrated in FIG. 1 hereinbefore, with the only difference being that the heating layer 130 is thick enough that a support (reference numeral 60 of FIG. 1) is unnecessary. The substrate 132 is therefore mechanically stable enough to be adequately bonded to the heat sink base 140.

Although the invention has been shown and described with exemplary embodiments thereof, it should be understood by those skilled in the art that the foregoing and other various changes, omissions and additions may be made therein and thereto without departing from the spirit and the scope of the invention.

What is claimed is:

1. A method for temperature cycling a wafer comprising the steps of:
   a) providing an electrostatic chuck including from top to bottom:
      an electrically insulative, thermally conductive isolation layer having a top surface for placement of the wafer thereon;
      an electrostatic pattern layer having a first electrically conductive pattern disposed thereon for generating an electrostatic force for clamping the wafer and first electrically conductive vias disposed therethrough for conducting electrical energy to said first electrically conductive pattern;
      a heating layer having a second electrically conductive pattern disposed thereon for generating heat for heating the wafer, second electrically conductive vias disposed therethrough for conducting electrical energy to said first electrically conductive vias, and third electrically conductive vias disposed therethrough for conducting electrical energy to said second electrically conductive pattern;
      a support having fourth and fifth electrically conductive vias disposed therethrough for conducting electrical energy to said second and third electrically conductive vias respectively; and,
      a heat sink base having access holes provided therethrough for providing access to said fourth and fifth vias, cooling channels provided therein for circulating a coolant, and at least one chamber provided therein;
   b) placing the wafer on said top surface;
   c) providing electrical energy to said fourth electrically conductive vias to thereby clamp the wafer to said top surface;
   d) providing electrical energy to said fifth electrically conductive vias and evacuating said chamber to thereby heat the wafer; and,
   e) providing no electrical energy to said fifth electrically conductive vias and filling said chamber with a thermally conductive gas to thereby cool the wafer.

2. A method for temperature cycling a wafer comprising the steps of:
   a) providing an electrostatic chuck for clamping the wafer comprising, from top to bottom:
      an electrically insulative, thermally conductive isolation layer having a top surface for placement of the wafer thereon;
      an electrostatic pattern layer having: a first electrically conductive pattern disposed thereon for generating an electrostatic force for clamping the wafer to said top surface; and first electrically conductive vias disposed therethrough for conducting electrical energy to said first electrically conductive pattern;
      a heating layer having a second electrically conductive pattern disposed thereon for generating heat for heating the wafer, second electrically conductive vias disposed therethrough for conducting electrical energy to said first electrically conductive vias, and third electrically conductive vias disposed therethrough for conducting electrical energy to said second electrically conductive pattern; and,
      a heat sink base having access holes provided therethrough for providing access to said second and third vias, cooling channels provided therein for circulating a coolant, and at least one chamber provided therein;
   b) placing the wafer on said top surface;
   c) providing electrical energy to said second electrically conductive vias to thereby clamp the wafer to said top surface;
   d) providing electrical energy to said third electrically conductive vias and evacuating said chamber to thereby heat the wafer; and,
   e) providing no electrical energy to said fifth electrically conductive vias and filling said chamber with a thermally conductive gas to thereby cool the wafer.

3. A method for temperature cycling a wafer comprising the steps of:
   a) providing an electrostatic chuck for clamping the wafer comprising, from top to bottom:
      an electrically insulative, thermally conductive isolation layer having a top surface for placement of the wafer thereon;
      a ceramic electrostatic pattern layer having: a clamping pattern disposed thereon for generating an electrostatic force for clamping the wafer, said clamping pattern being comprised of a pyrolytic graphite arranged in a plurality of alternating strips, each said strip being electrically energized with an opposite DC potential of that of adjacent strips; and, a plurality of first electrically conductive vias disposed therethrough for conducting electrical energy to said clamping pattern;

a heating layer comprised of boron nitride and having: a heating pattern disposed thereon comprised of pyrolytic graphite for generating heat for heating the wafer; a plurality of second electrically conductive vias disposed therethrough for conducting electrical vias and clamping pattern; and, third electrically conductive vias disposed therethrough for conducting electrical energy to said heating pattern; and, a heat sink base comprised of an iron/nickel/cobalt alloy having: access holes provided therethrough for providing access to said second and third electrically conductive vias; cooling channels provided therein for circulating a coolant; and, at least one chamber provided therein;

b) placing the wafer on said top surface;

c) providing electrical energy to said second electrically conductive vias to thereby clamp the wafer to said top surface;

d) providing electrical energy to said third electrically conductive vias and evacuating said chamber to thereby heat the wafer; and, e) providing no electrical energy to said third electrically conductive vias and filling said chamber with a thermally conductive gas to thereby cool the wafer.

4. A method for temperature cycling a wafer comprising the steps of:

a) providing an electrostatic chuck for clamping the wafer comprising, from top to bottom:

an electrically insulative, thermally conductive isolation layer having a top surface for placement of the wafer thereon;

an electrostatic pattern layer having: a first conductive pattern disposed thereon for generating an electrostatic force for clamping the wafer, said first conductive pattern being comprised of pyrolytic graphite arranged in a plurality of alternating conductive strips, each said conductive strip being electrically energized with an opposite DC potential of that of adjacent strips; and, a plurality of first electrically conductive vias disposed therethrough for conducting electrical energy to said first conductive pattern;

a heating layer comprised of boron nitride and having: a heating pattern disposed thereon comprised of pyrolytic graphite for generating heat for heating the wafer; a plurality of second electrically conductive vias disposed therethrough for conducting electrical energy to said first vias; and, a plurality of their electrically conductive vias disposed therethrough for conducting electrical energy to said heating pattern;

a support having: a plurality of fourth electrically conductive vias disposed therethrough for conducting electrical energy to said second electrically conductive vias; and, a plurality of fifth electrically conductive vias disposed therethrough for conducting electrical energy to said third electrically conductive vias; and, a heat sink base comprised of an iron/nickel/cobalt alloy having: access holes provided therethrough for providing access to said fourth and fifth electrically conductive vias; cooling channels provided therein for circulating a coolant; and, at least one chamber provided therein;

b) placing the wafer on said top surface;

c) providing electrical energy to said fourth electrically conductive vias to thereby clamp the wafer to said top surface;

d) providing electrical energy to said fifth electrically conductive vias and evacuating said chamber to thereby heat the wafer; and, e) providing no electrical energy to said fifth electrically conductive vias and filling said chamber with a thermally conductive gas to thereby cool the wafer.

5. A method for temperature cycling a wafer according to claims 1, 2, 3, or 4, further comprising the step of repeating steps d) and e).

6. A method for temperature cycling a wafer according to claims 1, 2, 3, 4, or 5, wherein the order of said steps d) and e) is reversed.

* * * * *